United States Patent
Knoop

(10) Patent No.: US 8,593,270 B2
(45) Date of Patent: Nov. 26, 2013

(54) TESTER FOR TESTING SIGNAL LINES OF A FLIGHT CONTROL SYSTEM FOR A THS MOTOR OF AN AIRCRAFT

(75) Inventor: Sven Knoop, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 709 days.

(21) Appl. No.: 12/744,968

(22) PCT Filed: Nov. 29, 2007

(86) PCT No.: PCT/EP2007/010377
§ 371 (c)(1),
(2), (4) Date: Sep. 3, 2010

(87) PCT Pub. No.: WO2009/068063
PCT Pub. Date: Jun. 4, 2009

(65) Prior Publication Data
US 2011/0043369 A1 Feb. 24, 2011

(51) Int. Cl.
| | |
|---|---|
| B60R 25/10 | (2006.01) |
| G08B 21/00 | (2006.01) |
| G01C 23/00 | (2006.01) |
| G01R 31/02 | (2006.01) |
| B64C 3/38 | (2006.01) |

(52) U.S. Cl.
USPC ........ 340/428; 340/661; 340/662; 340/853.2; 340/975; 324/418; 324/522; 324/533; 324/750.1; 324/602; 701/3; 434/45

(58) Field of Classification Search
USPC ........................................................ 340/428
See application file for complete search history.

(56) References Cited

U.S. PATENT DOCUMENTS

| | | | | |
|---|---|---|---|---|
| 4,825,375 | A | * | 4/1989 | Nadkarni et al. ................. 701/3 |
| 5,286,203 | A | * | 2/1994 | Fuller et al. ..................... 434/45 |

(Continued)

FOREIGN PATENT DOCUMENTS

| | | |
|---|---|---|
| CN | 101 082 641 A | 12/2007 |
| FR | 2 807 165 A | 10/2001 |

(Continued)

OTHER PUBLICATIONS

International Search Report for Appl. No. PCT/EP2007/010377 dated Aug. 27, 2008.

Primary Examiner — Jennifer Mehmood
Assistant Examiner — Fekadeselassie Girma
(74) Attorney, Agent, or Firm — Carter, DeLuca, Farrell & Schmidt LLP

(57) ABSTRACT

The present invention relates to a tester, its use and a method for testing signal lines of a flight control system for a trimmable horizontal stabilizer (THS) motor of an aircraft. The tester comprises at least one test-relay (52, 54) to be connected with a relay socket of the flight control system, when the signal lines of the flight control system are to be tested, and at least one indicator (60, 70, 80, 90) being electrically connected with the at least one test-relay (52, 54) for indicating whether a voltage being applied to the test-relay (52, 54) is equal to or larger than a predetermined voltage. The method according to the invention comprises the steps of connecting at least one test-relay (52, 54) of a tester (1), in place of the original relay, with the relay socket of the flight control system, applying a voltage to the at least one test-relay (52, 54) and determining whether a voltage being applied to the at least one test-relay (52, 54) is equal to or larger than a predetermined voltage.

9 Claims, 2 Drawing Sheets

(56) References Cited

U.S. PATENT DOCUMENTS

| | | |
|---|---|---|
| 7,264,875 B2 | 9/2007 | Hayashi et al. |
| 8,386,093 B2 * | 2/2013 | Lin et al. ............... 701/3 |
| 2005/0256662 A1 | 11/2005 | Alder |
| 2006/0144996 A1 * | 7/2006 | Carl et al. ............ 244/99.2 |
| 2011/0316544 A1 * | 12/2011 | Kirsch ................... 324/418 |

FOREIGN PATENT DOCUMENTS

| | | |
|---|---|---|
| FR | 2 866 436 A | 8/2005 |
| WO | WO 03/081270 A | 10/2003 |

* cited by examiner

TESTER FOR TESTING SIGNAL LINES OF A FLIGHT CONTROL SYSTEM FOR A THS MOTOR OF AN AIRCRAFT

Tester for testing signal lines of a flight control system for a THS motor of an aircraft The present invention relates to a tester, its use and a method for testing signal lines of a flight control system for a trimmable horizontal stabilizer (THS) motor of an aircraft.

BACKGROUND ART

The motor responsible for actuating the trimmable horizontal stabilizer (THS) onboard of an aircraft shall not be started under specific circumstances, even though a control signal is initiated by e.g. the pilot in the cockpit of the aircraft which would otherwise cause start of the THS-motor. Such specific circumstances include flight situations in which start of the THS-motor would have an adverse or even catastrophic effect on the flight safety of the aircraft.

The THS-motor is typically controlled by an avionic unit, or the flight control system, which includes two relays (relay 51CE and relay 52CE), and depending on the voltage) (normally 28 V) applied to the driving contacts (the coil contacts) of each of the two relays, start of the THS-motor is inhibited even if control signals from e.g. the cockpit are transmitted via the avionic unit to the two relays. Hence, depending on the voltage applied to the driving contacts of the two relays, the THS-motor cannot be started irrespective of any other control signals being present in the avionic unit.

Flight safety still is and has been of paramount importance. Therefore, frequent maintenance and inspection tests have to be conducted on the aircraft. One of these tests includes testing the electronic control infrastructure of the flight control system which establishes control of the THS-motor. In particular, the objective of these tests is to ensure that a particular voltage is applied to the driving contacts of the two relays included in the avionic unit which establishes control of the THS-motor. Thus, by successful completion of these tests, it can be ensured that start of the THS-motor is inhibited in situations in which it would otherwise have a detrimental effect on the flight safety.

A so-called ESAO (Environmentally Sustainable Airport Operation) system is used during ground tests of the aircraft for simulating predefined flight situations in the electronic flight control system and for double-checking whether individual components of the flight control system are behaving as specified. The ESAO-system initiates control signals which are then transmitted along the conducting paths of the flight control system to the THS-motor. On the basis of the simulation signals provided by the ESAO-system, it must be verified whether the simulation signals are processed by the flight control system in a correct manner and are converted into appropriate control signals for applying correct voltages on e.g. the two relays 51CE and 52CE responsible for controlling the THS-motor.

In particular with regard to flight situations which require inhibition of the start of the THS-motor, the ESAO-system initiates simulation signals as a consequence of which a voltage is applied to the 51CE relay and 52CE relay in order to ensure that the THS-motor cannot be started irrespective of any other control signals that might be initiated on board of the aircraft.

Up to now, the voltage applied to the relays 51CE and 52CE (28 Volt) had to be manually measured. To this end, simulation of different flight situations by means of the ESAO-system was initiated by a first operator, and a second operator being connected to the first operator via a radio communication system, had to be in close proximity to the relays 51CE and 52CE in order to verify that dependent on the simulated flight situations, the voltage applied to the two relays 51CE and 52CE was within a specified range. Thus, these inspection tests required much manpower and were cost-intensive.

It is therefore an object of the invention to provide a testing device which considerably facilitates ground tests of an aircraft, in particular ground tests in the course of which the control logic for controlling the THS-motor is tested.

SUMMARY

This and other objects are solved by a tester for testing signal lines of a flight control system for a trimmable horizontal stabilizer (THS) motor of an aircraft, wherein the flight control system includes at least one relay inserted into a corresponding relay socket. The tester comprises at least one test-relay to be connected with the relay socket, when the signal lines of the flight control system are to be tested, and at least one indicator being electrically connected with the at least one test-relay for indicating whether a voltage being applied to the at least one test relay is equal to or larger than a predetermined voltage.

With the tester according to the invention, the ground tests of an aircraft, in particular tests relating to the THS-motor control, can be conducted by only one operator. The operator can initiate the ESAO-system for providing simulation signals to the relays included in the control system of the THS-motor, and at the same time can conduct tests on the control system of the THS-motor. To this end, the operator takes out the two actual relays (51CE and 52CE) from the corresponding relay sockets and inserts into the sockets plugs electrically connected to test-relays of the testing device. Thus, not the actual relays themselves are tested, but rather the components and the control logic upstream of the two actual relays is inspected. The indicator of the tester immediately indicates to the operator whether the correct voltage is applied to the driving contacts of the test-relay. Thus, the operator can verify whether the actual relay will terminate the current flow to the THS-motor in flight situations in which start of the THS-motor shall be inhibited.

Preferably, the tester according to the invention comprises a first indicator and a second indicator, wherein the first indicator indicates whether a voltage being applied to the test-relay is equal to or larger than the predetermined voltage, and wherein the second indicator indicates whether the voltage is less than the predetermined voltage. Thus, depending on whether the first indicator or the second indicator is active, the operator immediately knows whether the voltage applied to the actual relay would be sufficient to inhibit start of the THS-motor.

In another preferred embodiment of the present invention, the tester comprises a first test-relay and a second test-relay. Both the first test-relay and the second test-relay are electrically connected with its own first and second indicators, that is to say, the first test-relay is connected to a first and second indicator, and the second test-relay is electrically connected to a first and second indicator. Hence, for each test-relay, two indicators are provided for indicating whether a correct voltage is applied to each of the test-relays, and whether the applied voltage is equal to or larger than a predetermined voltage.

Preferably, each indicator of the relay socket tester of the present invention outputs a visual signal. According to a preferred embodiment of the present invention, each indicator is a light emitting diode. For distinguishing between failure or pass of the ground test of the control logic for the THS motor, the light emitting diodes are emitting light of different colour so that the operator can verify at one glance whether the components of the avionic unit upstream of the actual relay fulfil the required specifications.

Preferably, the tester according to the invention comprises a test-relay plug which is to be inserted into the relay socket of the flight control system to be tested. Thus, the actual relays 51CE and 52CE can easily be replaced by inserting two test-relay plugs into the corresponding relay sockets, and the tester immediately indicates whether the voltage applied to the test-relays would be such that start of the THS-motor is inhibited in predefined flight situations.

Preferably, the predetermined voltage which is to be applied to the driving contacts of the relay socket for inhibiting start of the THS-motor in specific flight situations is 28 Volt.

In another aspect, the invention features use of a tester, as previously described, for testing signal lines of a flight control system for a trimmable horizontal stabilizer (THS) motor of an aircraft.

In another aspect, the invention features a method for testing signal lines of a flight control system for a trimmable horizontal stabilizer motor of an aircraft, which flight control system includes at least one relay inserted into a corresponding relay socket. The method according to the invention comprises the steps of connecting at least one test-relay of a tester, in place of the at least one relay of the flight control system, with the relay socket of the flight control system, applying a voltage to the at least one test relay, and determining whether a voltage being applied to the test-relay is equal to or larger than a predetermined voltage.

Preferably, the ESAO system accounts for applying a voltage to the at least one test-relay.

According to a preferred embodiment, the method comprises the step of simultaneously determining whether voltages being applied to two test-relays which are inserted into two corresponding serially connected relay sockets of the flight control system are equal to or larger than a predetermined voltage.

Other features and advantages of the invention will become apparent from the following detailed description of a preferred embodiment of the invention, thereby referring to the appended drawings.

DETAILED DESCRIPTION OF A PREFERRED EMBODIMENT

Figure 1:
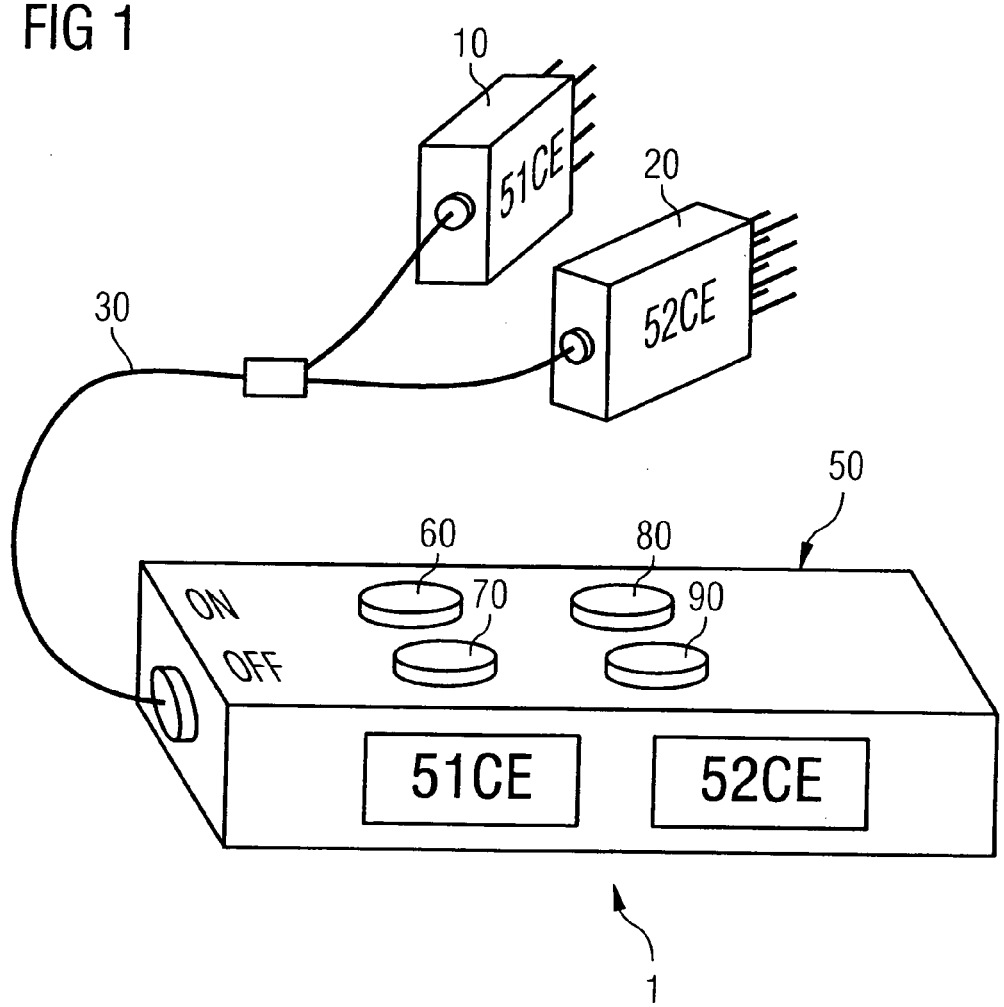
FIG. 1 is a schematic perspective view of a relay socket tester according to the present invention.

The preferred embodiment of the tester according to the invention is shown in FIG. 1. Tester 1 is particularly suitable for testing signal lines of a flight control system of a trimmable horizontal stabilizer (THS) motor of an aircraft. More specifically, tester 1 according to the invention is particularly intended to be used for testing the components, signal lines, terminals etc. of the flight control system upstream of the THS-motor during ground tests of an aircraft using an ESAO-system which is capable of simulating different flight situations.

Tester 1 comprises two plugs 10, 20 which are to be inserted into respective relay sockets (not shown), thereby replacing the original relays, such as 51CE and 52CE, of the avionic unit. The plugs 10, 20 are connected to a tester housing 50 via cable 30. The cable 30 may have any length, such as a length of 10 meters, in order to enhance freedom of use of the tester.

As can be seen in FIG. 1, housing 50 comprises indicators, such as light emitting diodes 60, 70, 80, 90. In the preferred embodiment, light emitting diodes 60, 80 and light emitting diodes 70, 90 emit light of different colours, such as red and green. During operation of the tester 1, LEDs 60, 80 and LEDs 70, 90 indicate whether the voltage applied to the signal lines of the flight control system equals a predetermined voltage. If the voltage equals the predetermined voltage, LEDs 60, 80 will be active, whereas LEDs 70, 90 will be active when the voltage is less than the predetermined voltage.

Figure 2:
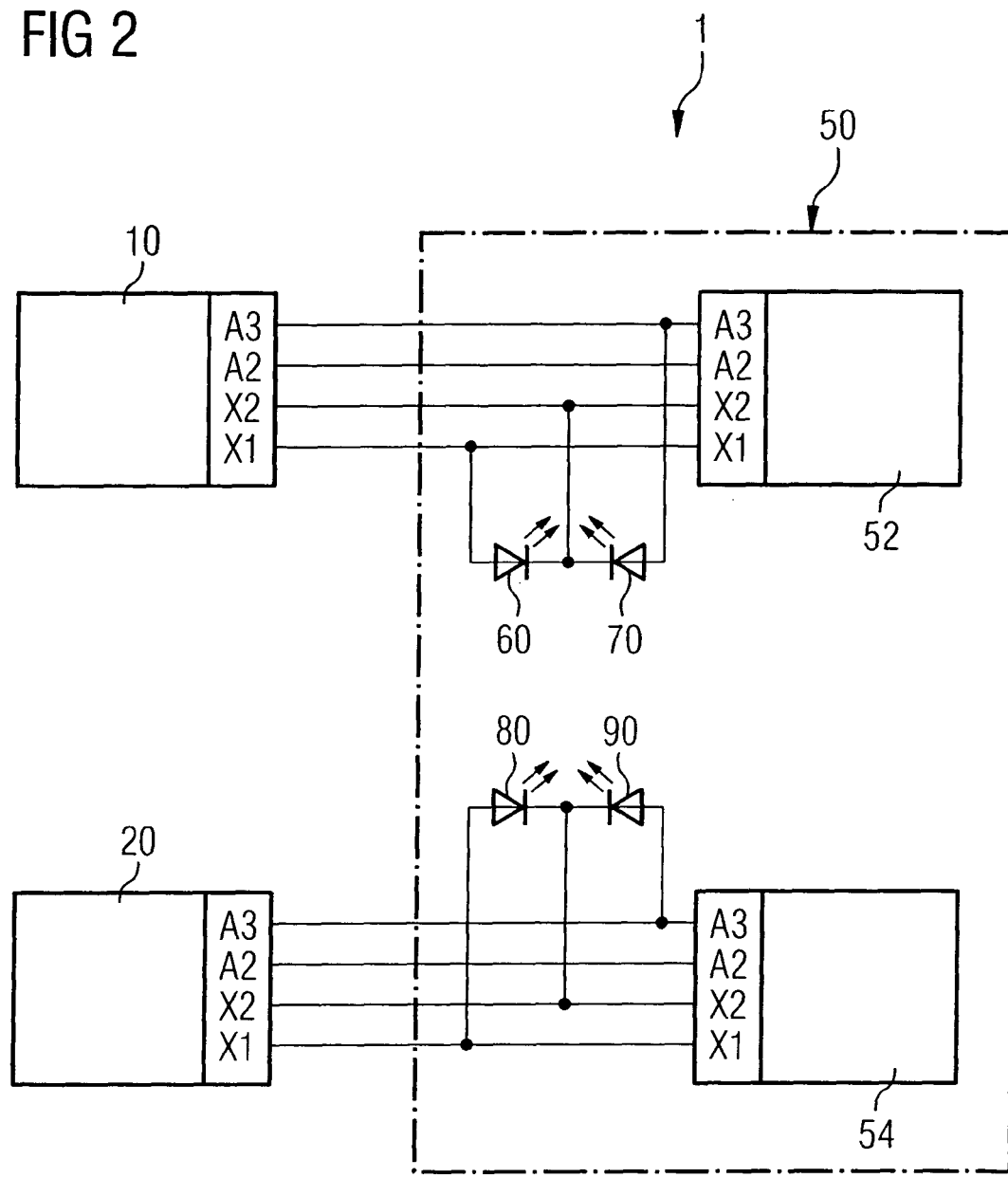
FIG. 2 is a wiring diagram of the relay socket tester shown in FIG. 1.

Referring to FIG. 2, a schematic wiring is shown of the tester 1 of FIG. 1. Like reference numerals indicate identical or similar components of the tester as shown in FIG. 1.

Tester housing 50 accommodates two test-relays 52, 54, each of which is electrically connected via conducting paths to plugs 10, 20. X1, X2 indicate driving contacts (coil contacts) of test-relays 52, 54, and A2, A3 indicate armature contacts of the test-relays 52, 54. Furthermore, light emitting diodes 60, 70 and 80, 90 are connected to respective conducting paths between plugs 10, 20 and test-relays 52, 54. Specifically, light emitting diodes 60, 80 are connected to respective conducting paths of driving contacts X1 and X2, whereas light emitting diodes 70, 90 are connected to conducting paths of armature contacts X2 and A3 of test-relays 52, 54.

Once the plugs 10, 20 are inserted into respective relay sockets of the avionic system, and the voltage applied by the ESAO system via the avionic unit to contacts X1, X2 (X2 is the ground contact) of the test-relays 52, 54 is equal to or larger than a predetermined voltage, light emitting diodes 60, 80 will be active. In other words, light will be emitted by light-emitting diodes 60, 80 in the event that the voltage applied to contacts X1 and X2 is equal to or larger than 28 V. In this situation, light emitting diodes 70, 90 will be inactive due to contacts A2, A3 not being closed by test-relays 52, 54. If, however, the voltage applied to contacts X1 and X2 is less than 28 V, test-relays 52, 54 will close armature contacts A2, A3, and hence, light emitting diodes 70, 90 will be active and light emitting diodes 60, 80 will be inactive.

The essence of the invention is to provide the maintenance staff of an aircraft with an easy and convenient way of testing the signal lines of a flight control system of, for example, a THS-motor of an aircraft. To this end, the original relays (51CE and 52CE) are taken out of their respective relay sockets, and instead, plugs 10, 20 of the tester according to the present invention are inserted therein. Upon start of the ESAO-system which simulates different flight situations, it must be determined whether the voltage applied during this test to the signal lines of the flight control system, and thus to the driving contacts X1 and X2 of the test relays 52, 54 equals a predetermined voltage of 28 V. This voltage corresponds to the voltage which is applied to the driving contacts of the actual relays 51CE and 52CE during operation of the aircraft, and which would inhibit start of the THS-motor in predefined flight situations. Thus, instead of testing the actual relays 51CE and 52CE themselves, the tester according to the invention allows testing of the components, signal lines, terminals etc. of the avionic control unit upstream of the THS-motor in order to determine whether a correct voltage will be applied to the driving contacts of the actual relays 51CE and 52CE during operation of the aircraft which voltage inhibits start of the THS-motor in predefined flight situations. Consequently, flight safety is considerably enhanced.

By using the tester of the present invention, one operator is sufficient to start the ESAO-system and conduct the required ground tests on the avionic unit responsible for the control of the THS-motor.

The invention claimed is:

1. Test arrangement for testing signal lines of a flight control system for a trimmable horizontal stabilizer motor of an aircraft, the flight control system including at least one relay inserted into a corresponding relay socket, the test arrangement comprising:
   a simulation system which during ground tests of the aircraft provides a control signal to the signal lines of the flight control system to be tested so as to simulate a predefined flight situation, and
   a tester including at least one test-relay, wherein the test relay is configured to be inserted into a relay socket of the flight control system to connect the test-relay to the relay socket in place of the relay of the flight control system, when the signal lines of the flight control system are to be tested, and
   a first indicator as well as a second indicator being electrically connected to the at least one test-relay, wherein the first indicator configured to indicate whether a voltage being applied to the at least one test-relay in response to a control signal provided by the simulation system is equal to or larger than a predetermined voltage, and the second indicator is configured to indicate whether the voltage is less than the predetermined voltage.

2. Test arrangement as claimed in claim 1, wherein the at least one test-relay comprises a first test-relay and a second test-relay to be connected with corresponding relay sockets of the flight control system, when the signal lines of the flight control system are to be tested, each of the first test-relay and the second test-relay being electrically connected with first and second indicators, respectively.

3. Test arrangement as claimed in claim 2, wherein each of the first indicators is electrically connected to driving contacts of the first and second test-relays, respectively, and wherein each of the second indicators is electrically connected to an armature contact of the first and second test-relays, respectively.

4. Test arrangement as claimed in claim 1, wherein each indicator outputs a visual signal.

5. Test arrangement as claimed in claim 1, wherein each indicator is a light emitting diode, and wherein the first and the second light emitting diodes emit light of a different colour.

6. Test arrangement as claimed in claim 1, wherein the predetermined voltage is 28 V.

7. Test arrangement as claimed in claim 1, wherein each test relay is connected to a test-relay plug which is to be inserted into a corresponding relay socket of the flight control system to be tested.

8. Method for testing signal lines of a flight control system for a trimmable horizontal stabilizer motor of an aircraft, the flight control system including at least one relay inserted into a corresponding relay socket, the method comprising the steps of:
   inserting a test-relay of a tester into a relay socket of the flight control system to connect the test-relay to the relay socket in place of the relay of the flight control system,
   providing a control signal of a simulation system to the signal lines of the flight control system to be tested so as to simulate a predefined flight situation, wherein a voltage is applied to the at least one test-relay in response to the control signal provided by the simulation system,
   determining whether the voltage being applied to the at least one test-relay is equal to or larger than a predetermined voltage or less than the predetermined voltage,
   activating a first indicator, if the voltage being applied to the at least one test-relay is equal to or larger than the predetermined voltage, and
   activating a second indicator, if the voltage being applied to the at least one test-relay is less than the predetermined voltage.

9. Method according to claim 8, further comprising the step of:
   simultaneously determining whether voltages being applied to two test-relays which are connected to two corresponding serially connected relay sockets of the flight control system are equal to or larger than a predetermined voltage.

* * * * *